United States Patent
Yoon et al.

(10) Patent No.: US 9,728,591 B2
(45) Date of Patent: Aug. 8, 2017

(54) ORGANIC LIGHT EMITTING DIODE DISPLAY HAVING AN INSULATING AND A LIGHT BLOCKING MATERIALS COVERING AN INNER CIRCUMFERENTIAL SURFACE OF A TRANSMISSIVE HOLE

(71) Applicant: Samsung Display Co., Ltd., Yongin-si, Gyeonggi-do (KR)

(72) Inventors: Joo Sun Yoon, Seoul (KR); Ki Wan Ahn, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 13 days.

(21) Appl. No.: 15/003,711

(22) Filed: Jan. 21, 2016

(65) Prior Publication Data
US 2016/0233278 A1  Aug. 11, 2016

(30) Foreign Application Priority Data
Feb. 9, 2015 (KR) .................. 10-2015-0019674

(51) Int. Cl.
*H01L 27/15* (2006.01)
*H01L 27/32* (2006.01)
*H01L 51/52* (2006.01)

(52) U.S. Cl.
CPC ........ *H01L 27/3246* (2013.01); *H01L 27/326* (2013.01); *H01L 51/5284* (2013.01); *H01L 2251/5323* (2013.01)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
See application file for complete search history.

(56) References Cited

U.S. PATENT DOCUMENTS

2016/0013260 A1\* 1/2016 Ahn .................... H01L 27/3272
257/40

FOREIGN PATENT DOCUMENTS

| KR | 10-2007-0082581 A | 8/2007 |
| KR | 10-0858823 B1 | 9/2008 |
| KR | 10-0911993 B1 | 8/2009 |
| KR | 10-2009-0100920 A | 9/2009 |

\* cited by examiner

*Primary Examiner* — Hoai V Pham
(74) *Attorney, Agent, or Firm* — Knobbe Martens Olson & Bear LLP

(57) ABSTRACT

An organic light emitting diode (OLED) display according to an exemplary embodiment includes: a substrate including a display area for displaying an image and a transmissive area around the display area; an insulating layer formed on the transmissive area of the substrate; and a pixel definition layer formed on the substrate and defining a pixel area within the display area. The pixel definition layer may cover an inner circumferential surface of a transmissive hole formed in the insulating layer.

12 Claims, 6 Drawing Sheets

ORGANIC LIGHT EMITTING DIODE DISPLAY HAVING AN INSULATING AND A LIGHT BLOCKING MATERIALS COVERING AN INNER CIRCUMFERENTIAL SURFACE OF A TRANSMISSIVE HOLE

CROSS-REFERENCE TO RELATED APPLICATIONS

Any and all applications for which a foreign or domestic priority claim is identified in the Application Data Sheet as filed with the present application are hereby incorporated by reference under 37 CFR 1.57.

This application claims priority to and the benefit of Korean Patent Application No. 10-2015-0019674 filed in the Korean Intellectual Property Office on Feb. 9, 2015, the entire contents of which are incorporated herein by reference.

BACKGROUND

Field

The present disclosure relates to an organic light emitting diode (OLED) display, and more particularly, to a transparent OLED display.

Description of the Related Technology

Currently, as generally known display devices, there are a liquid crystal display (LCD), a plasma display panel (PDP), an organic light emitting diode (OLED) display, a field effect display (FED), an electrophoretic display, and the like.

Particularly, the OLED display includes two electrodes and an organic emission layer interposed therebetween, and emits light by combining electrons injected from one electrode and holes injected from the other electrode in the organic emission layer to generate excitons and using energy released by the excitons.

The OLED display may have a reduced thickness and weight since it has a self-luminance characteristic and does not require an additional light source, unlike the LCD.

In addition, the OLED display is receiving attention as a next generation display device since it represents high quality characteristics such as low power consumption, high luminance, and high response speed.

Recently, a display device formed with a transmissive area adjacent to an organic light emitting element where external light is transmitted is being developed.

The display device formed with the transmissive area is recognized as an overall transparent display device.

However, the external light is scattered to cause transmittance of the transmissive area to deteriorate when it passes through the transmissive area.

SUMMARY

An exemplary embodiment has been made in an effort to provide a transparent organic light emitting diode (OLED) display that is capable of preventing external light from being scattered in a transmissive area.

An OLED display according to an exemplary embodiment includes: a substrate including a display area for displaying an image and a transmissive area around the display area; an insulating layer formed on the transmissive area of the substrate; and a pixel definition layer formed on the substrate and defining a pixel area within the display area. The pixel definition layer covers an inner circumferential surface of a transmissive hole formed in the insulating layer.

The pixel definition layer may include an insulating material and a light blocking material.

The insulating material may include at least either one of a polyamide and a resin based on polyacrylates, polyimides, or siloxanes.

The light blocking material may include a black coloring agent.

The substrate may be a transparent substrate.

A common electrode may be positioned on the pixel definition layer within the transmissive area of the substrate.

The common electrode may be a transparent electrode.

The OLED display may further include an organic light emitting element positioned on the display area of the substrate.

The OLED display may further include a thin film transistor that is positioned between the substrate and the organic light emitting element and connected to the organic light emitting element.

The thin film transistor may further include an active layer positioned on the substrate.

The thin film transistor may include: an active layer positioned on the substrate; a gate electrode positioned on the active layer; and source and drain electrodes positioned on the gate electrode and connected to the active layer.

The organic light emitting element may include: a first electrode connected to the drain electrode of the thin film transistor; an organic emission layer positioned on the first electrode; and a second electrode positioned on the organic emission layer.

The insulating layer may include: a first insulating layer covering the source and drain electrodes; and a second insulating layer formed on the first insulating layer, and the pixel definition layer covers the second insulating layer and the first electrode.

The insulating layer may include a first insulating layer that covers the source and drain electrodes, and the pixel definition layer covers the first insulating layer and the first electrode.

According to the exemplary embodiment, scattering of the external light in the transmissive area can be prevented to increase transparency of the transparent display device.

DETAILED DESCRIPTION

Figure 1:
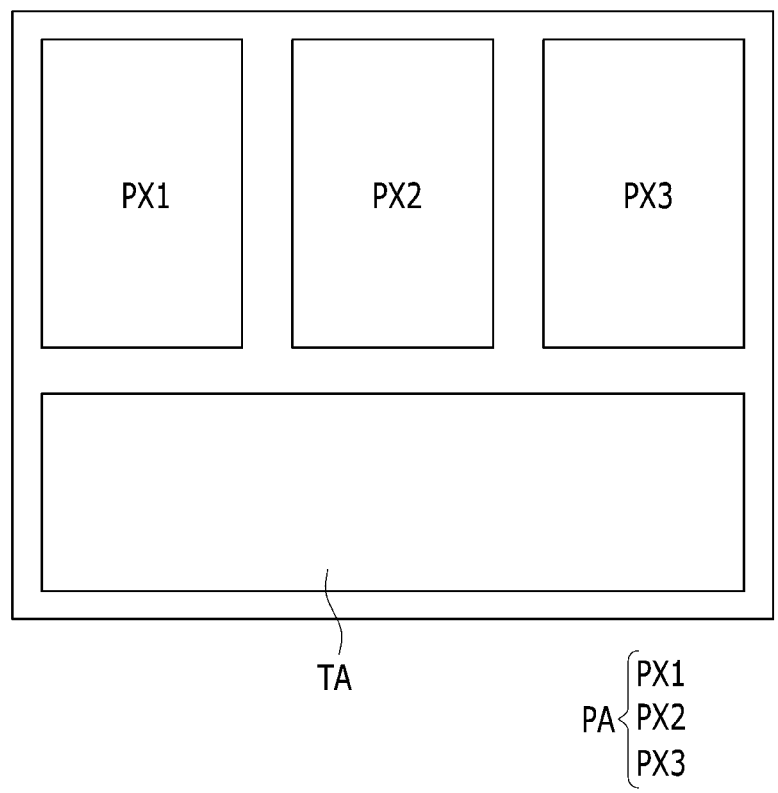
FIG. 1 is a layout view of an organic light emitting diode (OLED) display according to an exemplary embodiment.

As the disclosure allows for various changes and numerous embodiments, particular embodiments will be illustrated in the drawings and described in detail in the written description. However, this is not intended to limit the present disclosure to particular modes of practice, and it is to be appreciated that all changes, equivalents, and substitutes that do not depart from the spirit and technical scope of the present disclosure are encompassed in the present disclosure. As used herein, the term "and/or" includes any and all combinations of one or more of the associated listed items.

Embodiments of the present disclosure will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components. In the drawings, the thickness of layers, films, panels, regions, etc., are exaggerated for explanation. In other words, since sizes and thicknesses of components in the drawings are arbitrarily illustrated for convenience of explanation, the following embodiments are not limited thereto. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

In addition, when a layer is described to be formed "on" another layer or substrate, this means that the layer may be formed directly on the other layer or substrate, or a third layer may be interposed between the layer and the other layer or the substrate.

Like reference numerals designate like elements throughout the specification.

An organic light emitting diode (OLED) display according to a first exemplary embodiment will now be described with reference to FIGS. 1 to 5.

As shown in FIGS. 1 to 5, in the OLED display according to the exemplary embodiment, which is a transparent display device transparently perceived by light transmitted through a transmissive area TA, an inner circumferential surface of a transmissive hole 400 formed in the transmissive area TA may be covered by a pixel definition layer of a black-series color to prevent scattering of light.

Accordingly, transmittance of light in the transmissive area TA may increase to improve sharpness of the transparent display device.

Referring to FIG. 1, the OLED display according to the first exemplary embodiment includes a display area PA including a plurality of subpixels PX1, PX2, and PX3, and a transmissive area TA formed around the display area PA.

Each of the plurality of subpixels PX1, PX2, and PX3 in the display area PA includes an organic light emitting element 70, thin film transistors T1 and T2, etc.

In addition, the transmissive area TA corresponds to a region where external light is transmitted through the transmissive hole 400.

As the external light is transmitted through the transmissive area TA, the transparent display device is perceived as an overall transparent one.

First, referring to FIGS. 2 to 4, one subpixel of the display area PA will now be described in detail.

Figure 2:
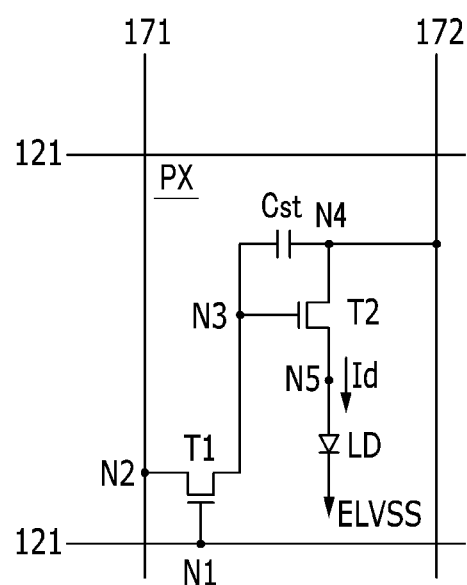
FIG. 2 is an equivalent circuit diagram of one pixel of the OLED display.

Referring to FIG. 2, the OLED display includes a plurality of signal lines 121, 171, and 172, and pixels PX connected thereto.

In this case, the pixels PX may be any one of a red pixel PX1, a green pixel PX2, and a blue pixel PX3.

The signal lines include gate lines 121 for transmitting a scanning signal, data lines 171 for transmitting a data signal, a driving voltage line 172 for transmitting a driving voltage, and the like.

The gate lines 121 substantially extend in a row direction and are nearly parallel to each other, while the data lines 171 substantially extend in a column direction and are nearly parallel to each other.

The driving voltage lines 172 are illustrated to substantially extend in the column direction, but they may extend in the row or column direction or have a net-like shape.

In this case, one pixel PX includes a thin film transistor including a switching transistor T1 and a driving transistor T2, a storage capacitor Cst, and an organic light emitting element LD.

Though not illustrated in the drawings, one pixel PX may further include a thin film transistor and a capacitor to compensate a current that is supplied to the organic light emitting element LD.

The switching transistor T1 includes a control terminal N1, an input terminal N2, and an output terminal N3.

In this case, the control terminal N1 is connected to the gate line 121, the input terminal N2 is connected to the data line 171, and the output terminal N3 is connected to the driving transistor T2.

The switching transistor T1 transmits the data signal transmitted via the data line 171 to the driving transistor T2 in response to the scanning signal transmitted via the gate line 121.

The driving transistor T2 also includes a control terminal N3, an input terminal N4, and an output terminal N5.

In this case, the control terminal N3 is connected to the switching transistor T1, the input terminal N4 is connected to the driving voltage line 172, and the output terminal N5 is connected to the organic light emitting element LD.

The driving transistor T2 outputs an output current Id, a magnitude of which varies according to a voltage applied between the control terminal N3 and the output terminal N5.

In this case, the capacitor Cst is connected between the control terminal N3 and the input terminal N4 of the driving transistor T2.

The capacitor Cst is charged with a data signal applied to the control terminal N3 of the driving transistor T2, and maintains the data signal even after the switching transistor T1 is turned off.

For example, as an organic light emitting diode (OLED), the organic light emitting element LD has an anode connected to the output terminal N5 of the driving transistor T2 and a cathode connected to a common voltage Vss.

The organic light emitting element LD displays an image by emitting light of varying intensities according to the output current Id of the driving transistor T2.

The organic light emitting element LD may contain an organic material that represents one or more of primary colors including three thereof such as red, green, and blue, and the OLED display displays a desired image with a spatial sum of these colors.

The switching transistor T1 and the driving transistor T2 are n-channel electric effect transistors (FETs), but at least one of them may be a p-channel FET.

In addition, a connection relationship between the transistors T1 and T2, the capacitor Cst, and the organic light emitting element LD may be changed.

A structure of the OLED display according to the first exemplary embodiment will now be described in detail with reference to FIGS. 3 to 5.

Figure 4:
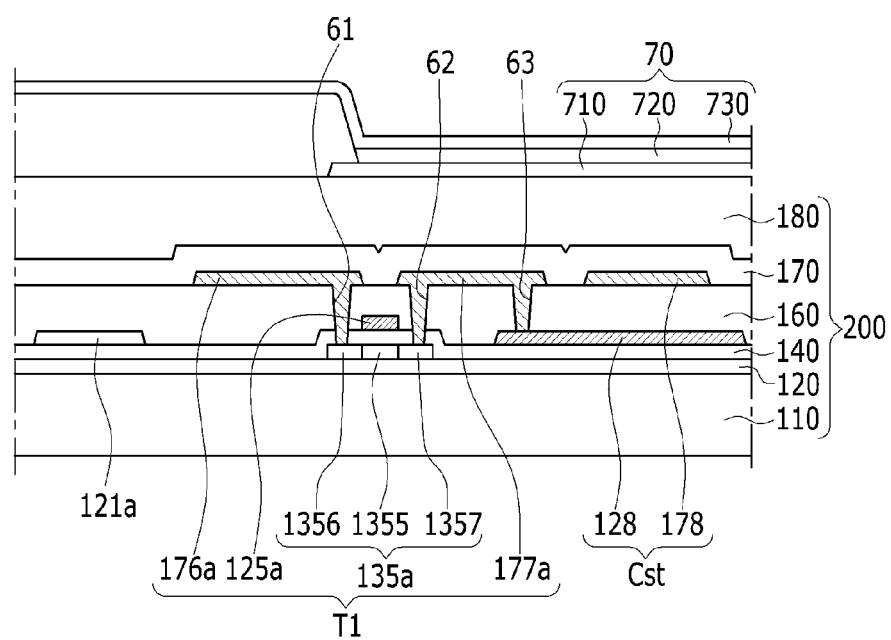
FIG. 4 is a cross-sectional view of the display device of FIG. 3 taken along the line IV-IV.

Referring to FIG. 4, a substrate 110 may be formed as an insulating substrate that is formed of glass, quartz, ceramic, plastic, etc.

A buffer layer 120 is formed on the substrate 110.

The buffer layer 120 may be formed as a single layer of a silicon nitride ($SiN_x$) or as a dual-layer in which a silicon nitride ($SiN_x$) and a silicon oxide ($SiO_x$) are laminated.

The buffer layer 120 serves to planarize a surface while preventing permeation of unnecessary materials such as impurities or moisture.

A switching semiconductor layer 135a and a driving semiconductor layer 135b are formed on the buffer layer 120 to be separated from each other.

These semiconductor layers 135a and 135b may be formed of polysilicon or an oxide semiconductor.

In this case, the oxide semiconductor may include one of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof such as zinc oxide (ZnO), indium-gallium-zinc oxide ($InGaZnO_4$), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O).

When the semiconductor layers 135a and 135b are formed of an oxide semiconductor, a separate passivation layer may be added to protect the oxide semiconductor that is vulnerable to an external environment such as high temperature and the like.

The semiconductor layers 135a and 135b include a channel region where impurities are not doped, and source and drain regions at opposite sides of the channel region where the impurities are doped.

In this case, the doped impurities may be changed depending on types of the thin film transistors, and may be n-type or p-type impurities.

The switching semiconductor layer 135a and the driving semiconductor layer 135b are divided into channel regions 1355 and source and drain regions 1356 and 1357 formed at opposite sides of the channel region 1355, respectively.

The channel regions 1355 of the switching semiconductor layer 135a and the driving semiconductor layer 135b may include polysilicon that is not doped with the impurities, that is, an intrinsic semiconductor.

In addition, the source and drain regions 1356 and 1357 of the switching semiconductor layer 135a and the driving semiconductor layer 135b may include polysilicon that is doped with conductive impurities, that is, an impurity semiconductor.

A gate insulating layer 140 is formed on the switching semiconductor layer 135a and the driving semiconductor layer 135b.

The gate insulating layer 140 may be a single layer or multiple layers including at least either one of a silicon nitride and a silicon oxide.

Figure 3:
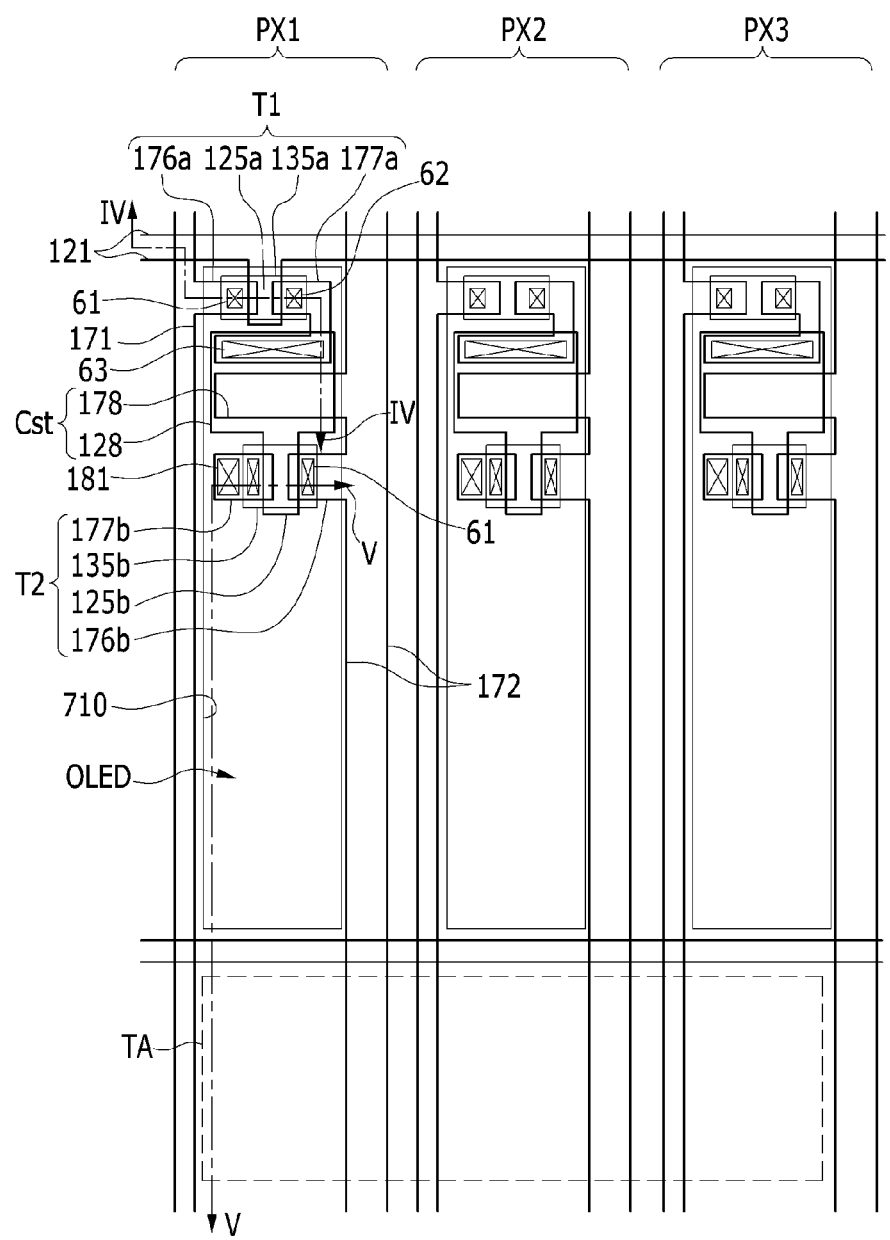
FIG. 3 is a layout view of one pixel of the OLED display according to the an exemplary embodiment.

Referring to FIG. 3, a gate line 121, a driving gate electrode 125b, and a first capacitor electrode 128 are formed on the gate insulating layer 140.

The gate line 121 extends in a horizontal direction, and transmits a scan signal to a switching transistor T1.

In this case, the gate line 121 includes a switching gate electrode 125a that protrudes toward the switching semiconductor layer 135a.

The driving gate electrode 125b protrudes toward the driving semiconductor layer 135b from the first capacitor electrode 128.

The switching gate electrode 125a and the driving gate electrode 125b overlap the channel region 1355, respectively.

An interlayer insulating layer 160 is formed on the gate line 121, the driving gate electrode 125b, and the first capacitor electrode 128.

The interlayer insulating layer 160 may be formed of a silicon nitride, a silicon oxide, or the like, as is the gate insulating layer 140.

In the interlayer insulating layer 160 and the gate insulating layer 140, a source contact hole 61 and a drain contact hole 62 are formed to respectively expose the source region 1356 and the drain region 1357, and a storage contact hole 63 is formed to expose some of the first capacitor electrode 128.

A data line 171 having a switching source electrode 176a, a driving voltage line 172 having a driving source electrode 176b and a second capacitor electrode 178, and a switching drain electrode 177a and a driving drain electrode 177b connected to the first capacitor electrode 128 are formed on the interlayer insulating layer 160.

The data line 171 transmits a data signal, and extends to cross the gate line 121.

The driving voltage line 172 transmits a driving voltage, and is separated from the data line to extend in the same direction as the data line 171.

The switching source electrode 176a protrudes toward the switching semiconductor layer 135a from the data line 171, and the driving source electrode 176b protrudes toward the driving semiconductor layer 135b from the driving voltage line 172.

The switching source electrode 176a and the driving source electrode 176b are connected to the source region 1356 through the source contact hole 61, respectively.

The switching drain electrode 177a faces the switching source electrode 176a, and the driving drain electrode 177b faces the driving source electrode 176b.

In addition, the switching drain electrode 177a and the driving drain electrode 177b are connected to the drain region 1357 through the drain contact hole 62, respectively.

The switching drain electrode 177a is extended to be electrically connected to the first capacitor electrode 128 and the driving gate electrode 125b through the contact hole 63 formed in the interlayer insulating layer 160.

The second capacitor electrode 178 protrudes from the driving voltage line 172 to overlap the first capacitor electrode 128.

Accordingly, the first capacitor electrode 128 and the second capacitor electrode 178 form the storage capacitor Cst using the interlayer insulating layer 160 as a dielectric material.

The switching semiconductor layer 135a, the switching gate electrode 125a, the switching source electrode 176a, and the switching drain electrode 177a form a switching thin film transistor T1.

Meanwhile, the driving semiconductor layer 135b, the driving gate electrode 125b, the driving source electrode 176b, and the driving drain electrode 177b form a driving thin film transistor T2.

The switching thin film transistor T1 and the driving thin film transistor T2 correspond to switching elements.

A passivation layer 180 is formed on the switching source electrode 176a, the driving source electrode 176b, the switching drain electrode 177a, and the driving drain electrode 177b.

According to the an exemplary embodiment, a lower passivation layer 170 may be formed under the passivation layer 180.

In this case, the lower passivation layer 170 may be disposed between the interlayer insulating layer 160 and the passivation layer 180.

In the disclosure, the lower passivation layer 170 and the passivation layer 180 may correspond to the same components as the first and second insulating layers.

A pixel electrode 710 is formed on the passivation layer 180.

In this case, the pixel electrode 710 may be formed of a transparent conductive material such as indium tin oxide (ITO), indium zinc oxide (IZO), zinc oxide (ZnO), indium oxide ($In_2O_3$), etc., or a reflective metal such as lithium, calcium, lithium fluoride/calcium, lithium fluoride/aluminum, aluminum, silver, magnesium, gold, etc.

Figure 5:
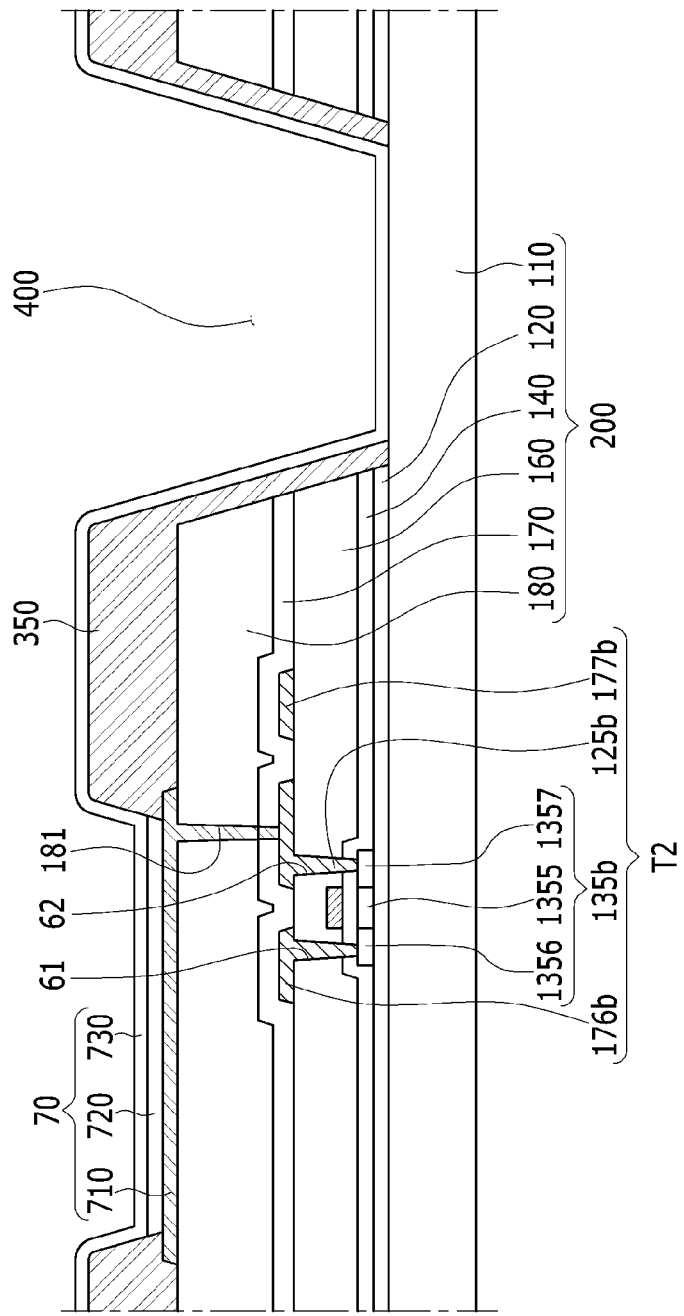
FIG. 5 is a cross-sectional view of the display device of FIG. 3 taken along the line V-V.

Referring to FIGS. 3 and 5, the pixel electrode 710 is electrically connected to the driving drain electrode 177b of the driving thin film transistor T2 through a contact hole 181 formed in the interlayer insulating layer 160, and becomes an anode of the organic light emitting element 70.

A pixel definition layer 350 is formed on edge portions of the passivation layer 180 and the pixel electrode 710.

The pixel definition layer 350 includes an opening that exposes the pixel electrode 710.

According to an exemplary embodiment, the pixel definition layer 350 may be formed of an insulating material and a light blocking material.

The light blocking material may be included in the pixel definition layer 350 to prevent scattering of light in a transmissive area to be described later.

This will be described later in detail.

In this case, the pixel definition layer 350 may include an insulating material such as a polyamide, a resin based on polyacrylates or polyimides, a siloxane-based resin, and a silica-based inorganic material.

In addition, the light blocking material of the pixel definition layer 350 may include a black coloring agent such as carbon black or titan black.

In addition, the light blocking material may use channel black, furnace black, thermal black, lamp black, etc., and may use an organic pigment such as a water-soluble azo pigment, a water-insoluble azo pigment, a phthalocyanine pigment, a quinacridone pigment, an isoindolinone pigment, an isoindoline pigment, a perylene pigment, a perynone pigment, a dioxazine pigment, an anthraquinone pigment, a dianthraquinonyl pigment, an anthrapyrimidine pigment, an anthanthrone pigment, an indanthrone pigment, a flavanthrone pigment, a pyranthrone pigment, a diketopyrrolopyrrole pigment, etc.

An organic emission layer 720 is formed in the opening of the pixel definition layer 350.

The organic emission layer 720 is formed as multiple layers including one or more of the emission layer, a hole-injection layer (HIL), a hole-transporting layer (HTL), an electron-transporting layer (ETL), and an electron-injection layer.

When the organic emission layer 720 includes all of them, the HIL is positioned on the pixel electrode 710 serving as the anode, and the HTL, the emission layer, the ETL, and the EIL may be sequentially laminated thereon.

The organic emission layer 720 may include a red organic emission layer emitting red light, a green organic emission layer emitting green light, and a blue organic emission layer emitting blue light. The red organic emission layer, the green organic emission layer, and the blue organic emission layer are respectively formed on a red pixel, a green pixel, and a blue pixel to implement a color image.

Further, the red organic emission layer, the green organic emission layer, and the blue organic emission layer are integrally laminated on the organic emission layer 720 together with the red pixel, the green pixel, and the blue pixel to respectively form a red color filter, a green color filter, and a blue color filter in each pixel so as to implement a color image.

Alternatively, a white organic emission layer emitting white light is formed on all of the red pixel, the green pixel, and the blue pixel, and a red color filter, a green color filter, and a blue color filter are respectively formed for every pixel to implement a color image.

When the color image is implemented by using the white organic emission layer and the color filter, a deposition mask for depositing the red organic emission layer, the green organic emission layer, and the blue organic emission layer on individual pixels, that is, the red pixel, the green pixel, and the blue pixel, is not required.

The white organic emission layer described in another exemplary embodiment may be formed to have a single organic emission layer, and may further include a configuration in which a plurality of organic emission layers are laminated to emit white light.

For example, a configuration in which at least one yellow organic emission layer and at least one blue organic emission layer are combined to emit white light, a configuration in which at least one cyan organic emission layer and at least one red organic emission layer are combined to emit white light, and a configuration in which at least one magenta organic emission layer and at least one green organic emission layer are combined to emit white light may be further included.

A common electrode 730 is formed on the pixel definition layer 350 and the organic emission layer 720.

The common electrode 730 may be made of a transparent conductive material such as indium tin oxide (ITO), indium zinc oxide (IZO), zinc oxide (ZnO), indium oxide ($In_2O_3$), etc., or a reflective metal such as lithium, calcium, lithium fluoride/calcium, lithium fluoride/aluminum, aluminum, silver, magnesium, gold, etc.

The common electrode 730 becomes a cathode of the organic light emitting element 70.

The pixel electrode 710, the organic emission layer 720, and the common electrode 730 form the organic light emitting element 70.

An overcoat (not shown) may be formed on the common electrode 730 to protect the organic light emitting element 70.

Referring to FIG. 5, a transmissive hole 400 is formed in a transmissive area TA.

As described above, external light is transmitted through the transmissive hole 400, thereby allowing the OLED display to be perceived as a transparent display device.

In this case, the transmissive hole 400 is formed in the transmissive area TA to penetrate the laminated insulating layers and the like.

In FIG. 5, the substrate 110 is exposed by the transmissive hole 400.

However, it is not limited thereto, and the insulating layer may be positioned on the substrate 110 and the insulating layer may be exposed by the transmissive hole 400.

However, the insulating layer and the substrate 110 may be transparent.

Meanwhile, the passivation layer 180, the lower passivation layer 170, the interlayer insulating layer 160, the gate insulating layer 140, and the buffer layer 120 may be penetrated by the transmissive hole 400.

However, as described above, only some of the plurality of layers may be penetrated by the transmissive hole 400.

However, the layers that are not penetrated may be transparently formed.

According to an exemplary embodiment, the pixel definition layer 350 covers an inner circumferential surface of the transmissive hole 400.

In this case, the pixel definition layer 350 may be formed of a light blocking material.

More specifically, as described above, the pixel definition layer 350 may be formed of an insulating material and a light blocking material.

The light blocking material may be included in the pixel definition layer 350 to prevent scattering of light in the transmissive area.

Generally, in the transparent display device, the external light transmitted through the transmissive hole 400 may be scattered on the inner circumferential surface of the transmissive hole 400.

As such, when the external light is scattered, transparency of the transparent display device deteriorates.

According to an exemplary embodiment, the inner circumferential surface of the transmissive hole 400 may be covered by the pixel definition layer 350 formed of the light blocking material, thereby preventing scattering of the external light.

In this case, the pixel definition layer 350 may include an insulating material such as a polyamide, a resin based on polyacrylates or polyimides, a siloxane-based resin, and a silica-based inorganic material.

In addition, the light blocking material of the pixel definition layer 350 may include a black coloring agent such as carbon black or titan black.

In addition, the light blocking material may use channel black, furnace black, thermal black, lamp black, etc., and may use an organic pigment such as a water-soluble azo pigment, a water-insoluble azo pigment, a phthalocyanine pigment, a quinacridone pigment, an isoindolinone pigment, an isoindoline pigment, a perylene pigment, a perynone pigment, a dioxazine pigment, an anthraquinone pigment, a dianthraquinonyl pigment, an anthrapyrimidine pigment, an anthanthrone pigment, an indanthrone pigment, a flavanthrone pigment, a pyranthrone pigment, a diketopyrrolopyrrole pigment, etc.

A common electrode 730 is formed on the pixel definition layer 350.

In this case, the common electrode 730 may be made of a transparent conductive material such as indium tin oxide (ITO), indium zinc oxide (IZO), zinc oxide (ZnO), indium oxide ($In_2O_3$), etc.

An OLED display according to a second exemplary embodiment will now be described with reference to FIG. 6.

When describing the OLED display of the second exemplary embodiment, a detailed description of components identical or similar to those of the OLED display of the first exemplary embodiment will be omitted.

Figure 6:
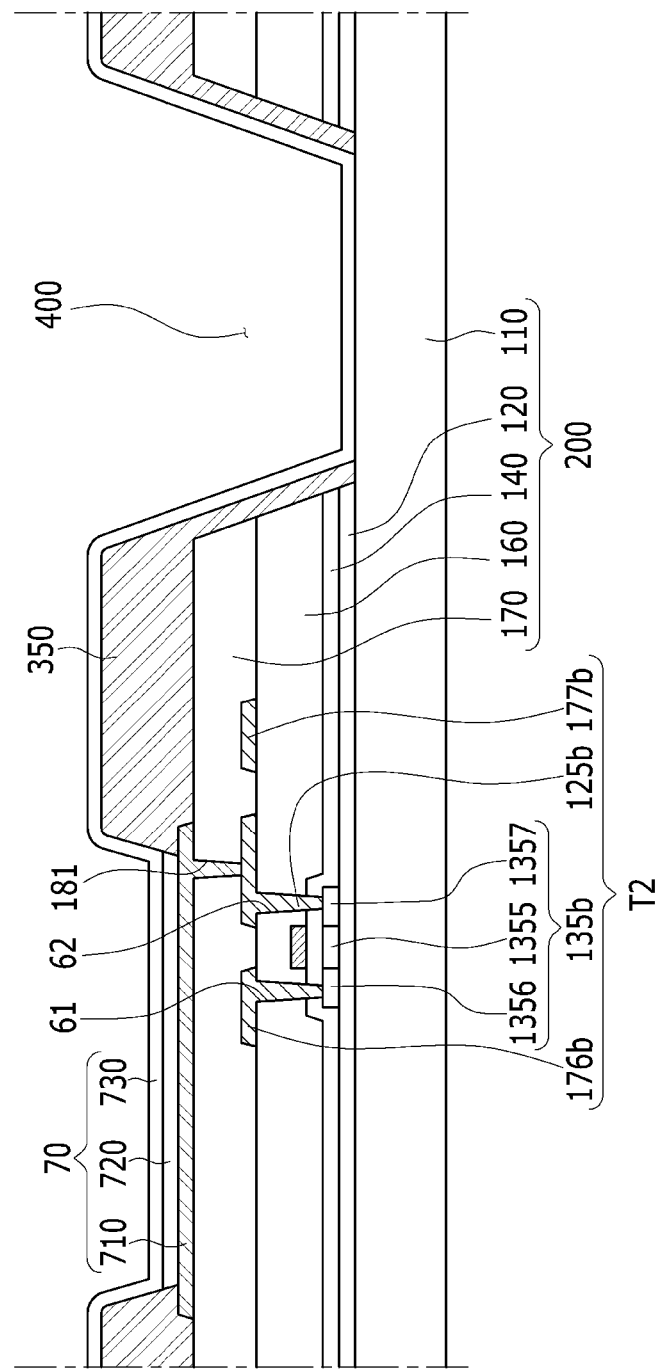
FIG. 6 is a cross-sectional view of a display device according to a second exemplary embodiment taken along the line V-V of FIG. 3.

Referring to FIG. 6, in the OLED display according to the second exemplary embodiment, the passivation layer 180 of the previous embodiment is not formed on the lower passivation layer 170.

The lower passivation layer 170 is positioned on the pixel definition layer 350.

The pixel definition layer 350 instead performs a function of the removed passivation layer 180.

Therefore, the pixel definition layer 350 is formed on the lower passivation layer 170 to perform a planarization function.

The second exemplary embodiment differs from the first exemplary embodiment in that the passivation layer 180 is removed and the pixel definition layer 350 instead performs the planarization function of the passivation layer 180.

According to the exemplary embodiment, the inner circumferential surface of the transmissive hole 400 may be covered by the pixel definition layer 350 formed of the light blocking material, thereby preventing scattering of the external light.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present disclosure have been described with reference to the figures, it will be understood by those of ordinary skill in the art that various changes in form and details may be made therein without departing from the spirit and scope of the present disclosure as defined by the following claims.

What is claimed is:

1. An organic light emitting diode (OLED) display comprising:
    a substrate including a display area for displaying an image and a transmissive area around the display area;
    an insulating layer formed on the transmissive area of the substrate; and
    a pixel definition layer formed on the substrate and defining a pixel area within the display area,
    wherein the pixel definition layer covers an inner circumferential surface of a transmissive hole formed in the insulating layer, wherein the pixel definition layer includes an insulating material and a light blocking material.

2. The OLED display of claim 1, wherein the insulating material includes at least either one of a polyamide and a resin based on polyacrylates, polyimides, or siloxanes.

3. The OLED display of claim 1, wherein the light blocking material includes a black coloring agent.

4. The OLED display of claim 1, wherein the substrate is a transparent substrate.

5. The OLED display of claim 1, wherein a common electrode is positioned on the pixel definition layer within the transmissive area of the substrate.

6. The OLED display of claim 5, wherein the common electrode is a transparent electrode.

7. The OLED display of claim 1, further comprising an organic light emitting element positioned on the display area of the substrate.

8. The OLED display of claim 7, further comprising a thin film transistor positioned between the substrate and the organic light emitting element and connected to the organic light emitting element.

9. The OLED display of claim 8, wherein the thin film transistor includes:
- an active layer positioned on the substrate;
- a gate electrode positioned on the active layer; and
- source and drain electrodes positioned on the gate electrode and connected to the active layer.

10. The OLED display of claim 9, wherein the organic light emitting element includes:
- a first electrode connected to the drain electrode of the thin film transistor;
- an organic emission layer positioned on the first electrode; and
- a second electrode positioned on the organic emission layer.

11. The OLED display of claim 10, wherein the insulating layer includes:
- a first insulating layer covering the source and drain electrodes; and
- a second insulating layer formed on the first insulating layer, and
- the pixel definition layer covers the second insulating layer and the first electrode.

12. The OLED display of claim 10, wherein the insulating layer includes a first insulating layer that covers the source and drain electrodes, and
- the pixel definition layer covers the first insulating layer and the first electrode.

* * * * *